US007935910B2

(12) United States Patent
Morikazu (10) Patent No.: US 7,935,910 B2
(45) Date of Patent: May 3, 2011

(54) METHOD OF LASER DRILLING VIAS

(75) Inventor: Hiroshi Morikazu, Tokyo (JP)

(73) Assignee: Disco Corporation, Tokyo (JP)

( * ) Notice: Subject to any disclaimer, the term of this patent is extended or adjusted under 35 U.S.C. 154(b) by 677 days.

(21) Appl. No.: 12/007,267

(22) Filed: Jan. 8, 2008

(65) Prior Publication Data

US 2008/0179302 A1 Jul. 31, 2008

(30) Foreign Application Priority Data

Jan. 26, 2007 (JP) ................................. 2007-017146

(51) Int. Cl.
*B23K 26/38* (2006.01)

(52) U.S. Cl. ............................ 219/121.71; 219/121.79

(58) Field of Classification Search ............... 219/121.7, 219/121.71, 121.79, 121.8
See application file for complete search history.

(56) References Cited

U.S. PATENT DOCUMENTS

| 5,841,099 | A  | * | 11/1998 | Owen et al. ............... 219/121.71 |
| 6,822,324 | B2 | * | 11/2004 | Tao et al. ...................... 257/710 |
| 7,675,002 | B2 | * | 3/2010  | Nomaru et al. ............ 219/121.7 |
| 2003/0047544 | A1 | * | 3/2003 | De Steur et al. ......... 219/121.71 |
| 2004/0164060 | A1 | * | 8/2004 | Maeda et al. ............ 219/121.71 |
| 2007/0045254 | A1 |   | 3/2007 | Morikazu |

FOREIGN PATENT DOCUMENTS

| JP | 2003-163323 | 6/2003 |
| JP | 2007-67082  | 3/2007 |

* cited by examiner

*Primary Examiner* — Geoffrey S Evans (74) *Attorney, Agent, or Firm* — Smith, Gambrell & Russell, LLP (57) ABSTRACT

A method of forming a via hole reaching a bonding pad in a wafer having a plurality of devices on the front surface of a substrate and bonding pads formed on each of the devices by applying a pulse laser beam from the rear surface side of the substrate, wherein when a pulse laser beam having a spot diameter which satisfies $D/2 \leq d \leq D-2$ μm (wherein a diameter of the via hole to be formed is represented as D and a spot diameter of the pulse laser beam is represented as d) is applied in such a manner that the periphery of the spot moves along the inner circumference of the via hole to be formed, the pulse laser beam is applied at an angle of 120 to 180° from the previous application position.

2 Claims, 6 Drawing Sheets

METHOD OF LASER DRILLING VIAS

FIELD OF THE PRESENT INVENTION

The present invention relates to a method of forming a via hole reaching a bonding pad in a wafer having a plurality of devices formed on the front surface of a substrate and bonding pads formed on each of the devices, by applying a pulse laser beam from the rear surface side of the substrate to the wafer.

DESCRIPTION OF THE PRIOR ART

In the production process of a semiconductor device, a plurality of areas are sectioned by dividing lines called "streets" arranged in a lattice pattern on the front surface of a substantially disk-like semiconductor wafer, and a device such as IC or LSI is formed in each of the sectioned areas. Individual semiconductor chips are manufactured by cutting this semiconductor wafer along the streets to divide it into the areas each having a device formed thereon.

To reduce the size and increase the number of functions of an apparatus, a modular structure in which a plurality of semiconductor chips are laminated and bonding pads of the laminated semiconductor chips are connected, has been implemented and disclosed by JP-A2003-163323. This modular structure has such a constitution that a plurality of devices are formed on the front surface of a substrate constituting a semiconductor wafer, bonding pads are formed on each of the devices, via holes reaching the bonding pads are formed from the rear surface side of the substrate at positions where the bonding pads have been formed, and a conductive material such as aluminum or copper to be connected to the bonding pads is embedded in each of the via holes.

The via holes formed in the above semiconductor wafer are generally formed by using a drill. However, the diameters of the via holes formed in the semiconductor wafer are as small as 100 to 300 μm, and drilling the via holes is not always satisfactory in terms of productivity. In addition, as the thickness of each of the above bonding pads is about 1 to 5 μm, the drilling must be controlled extremely accurately in order to form the via holes only in the substrate such as a silicon substrate that forms the wafer, without damaging the bonding pads.

To solve the above problem, the applicant of the present application has proposed as JP-A 2007-67082 a wafer perforating method for efficiently forming a via hole reaching a bonding pad in a wafer having a plurality of devices on the front surface of a substrate and bonding pads on each of the devices by applying a pulse laser beam from the rear surface side of the substrate.

Figure 10:
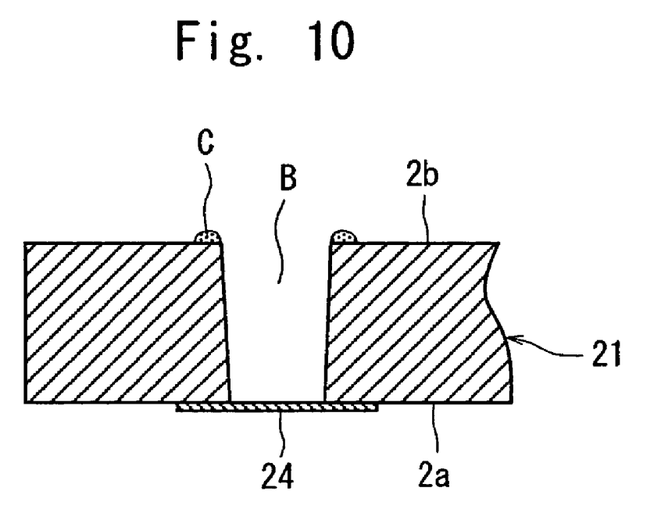
FIG. 10 is a sectional view of a wafer having a via hole formed by the laser processing of the prior art.

When a via hole reaching a bonding pad is formed by applying a pulse laser beam from the rear surface side of the substrate, debris C produced by applying a pulse laser beam to the substrate A accumulate annularly around the opening of a via hole B on the rear surface of the substrate A, as shown in FIG. 10. Since the debris C accumulate in a width of about 10 μm and a height of about 20 to 30 μm, there arises a problem in that when individually divided chips are stacked, the accumulated debris interfere with the stacking.

Figure 11:
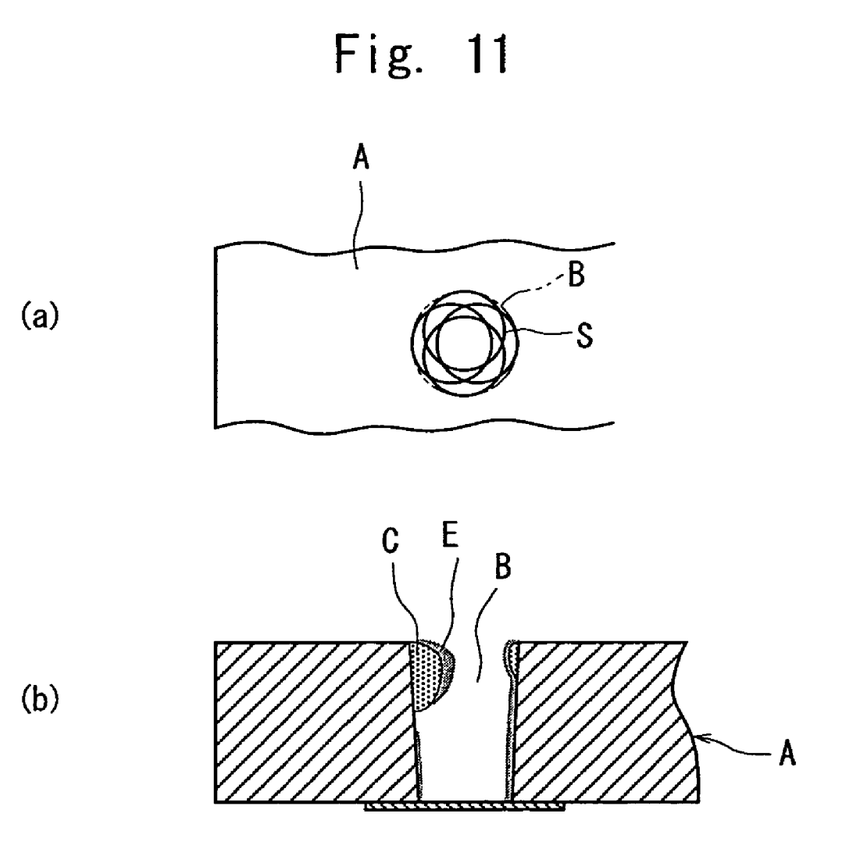
FIGS. 11(a) and 11(b) are sectional views of a wafer having a via hole formed by the laser processing of the prior art.

To solve the above problem, the inventor of the present invention has tried so-called "trepanning processing" in which a pulse laser beam having a spot diameter S smaller than the diameter of the via hole B to be formed in the substrate A is applied along the inner circumference of the via hole B to be formed at intervals of a predetermined angle, as shown in FIG. 11(a). Although the debris did not accumulate annularly around the opening of the via hole B by carrying out this trepanning processing, the debris C accumulated at one-sided position of the upper portion of the inner wall of an area where trepanning processing was started, as shown in FIG. 11(b).

Although a conductive material such as aluminum or copper is embedded in the via holes B formed in the substrate A as described above, when aluminum or copper is directly embedded in the via holes B, there arises a problem in that aluminum or copper atoms disperse into the inside of the substrate made of silicon to reduce the quality of each device. Therefore, after an insulating film is coated on the inner walls of the via holes B, a conductive material such as aluminum or copper is embedded.

However, when the debris C accumulate at the one-sided position of the upper portion of the inner wall of the via hole B as shown in FIG. 11(b), an insulating film E is not formed on the underside of the debris C. When a conductive material such as aluminum or copper is embedded in the via hole B in this state, aluminum or copper comes into direct contact with the substrate A, whereby aluminum or copper atoms disperse into the inside of the substrate made of silicon to cause deterioration in quality of each device.

SUMMARY OF THE INVENTION

It is an object of the present invention to provide a method capable of forming a via hole reaching a bonding pad by applying a laser beam from the rear surface side of a substrate without accumulating debris around the opening of the via hole on the rear surface of the substrate or without accumulating debris on the one-sided region of the upper portion of the inner wall of the via hole.

To attain the above object, according to the present invention, there is provided a method of forming a via hole reaching a bonding pad in a wafer having a plurality of devices formed on the front surface of a substrate and bonding pads formed on each of the devices by applying a pulse laser beam from the rear surface side of the substrate to the wafer, wherein when a pulse laser beam having a spot diameter which satisfies D/2≦d≦D−2 μm (wherein a diameter of the via hole to be formed is represented as D and a spot diameter of the pulse laser beam is represented as d) is applied in such a manner that the periphery of the spot moves along the inner circumference of the via hole to be formed, the pulse laser beam is applied at an angle of 120 to 180° from the previous application position.

In the via hole forming method of the present invention, when a diameter of the via hole to be formed is represented as D and a spot diameter of the pulse laser beam is represented as d, a pulse laser beam having a spot diameter which satisfies D/2≦d≦D−2 μm is applied in such a manner that the periphery of the spot moves along the inner circumference of the via hole to be formed, it is applied at an angle of 120 to 180° from the previous application position. Therefore, debris scattered by applying the pulse laser beam to the substrate of the wafer do not concentrate and hence, do not accumulate at one-sided position of the upper portion of the inner wall of the via hole.

DETAILED DESCRIPTION OF THE PREFERRED EMBODIMENTS

The via hole forming method of the present invention will be described in more detail hereinunder with reference to the accompanying drawings.

Figure 1:
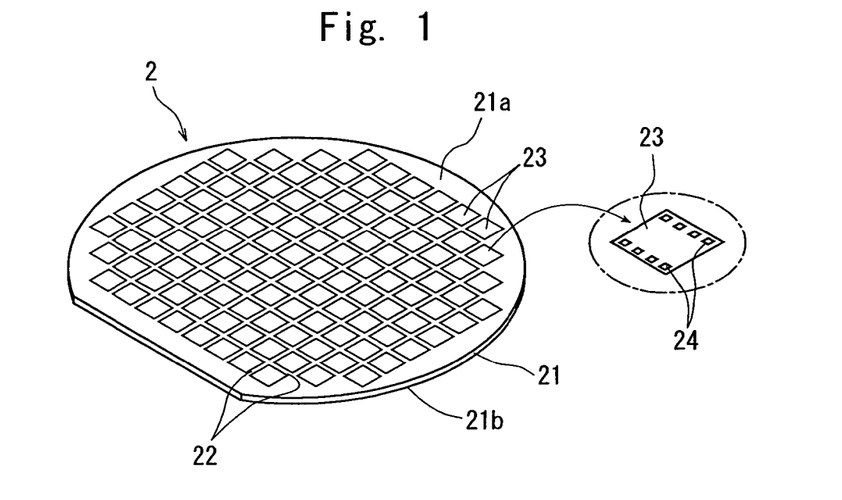
FIG. 1 is a perspective view of a semiconductor wafer as a wafer to be processed by the via hole forming method of the present invention.

FIG. 1 is a perspective view of a semiconductor wafer 2 as the wafer to be processed by the via hole forming method of the present invention. In the semiconductor wafer 2 shown in FIG. 1, a plurality of areas are sectioned by a plurality of streets 22 arranged in a lattice pattern on the front surface 21a of a substrate 21 made of silicon and having a thickness of, for example, 100 μm, and a device 23 such as IC or LSI is formed in each of the sectioned areas. The devices 23 are all the same in structure. A plurality of bonding pads 24 are formed on the surface of each device 23. The bonding pads 24 are made of a metal material such as aluminum, copper, gold, platinum or nickel and have a thickness of 1 to 5 μm.

Figure 2:
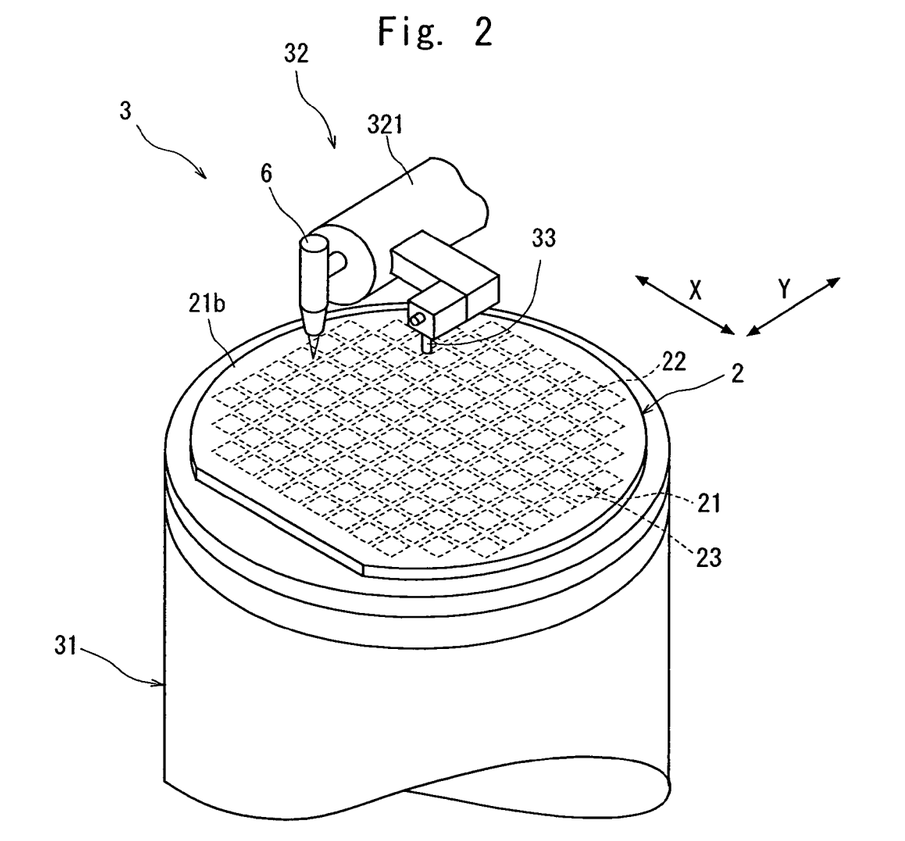
FIG. 2 is a perspective view of the principal portion of a laser beam processing machine for carrying out the via hole forming method of the present invention.

Via holes reaching the bonding pads 24 are formed in the above semiconductor wafer 2 by applying a pulse laser beam from the rear surface 21b side of the substrate 21. To form the via holes in the substrate 21 of the semiconductor wafer 2, a laser beam processing machine 3 shown in FIG. 2 is used. The laser beam processing machine 3 shown in FIG. 2 has a chuck table 31 for holding a workpiece and a laser beam application means 32 for applying a laser beam to the workpiece held on the chuck table 31. The chuck table 31 is constituted to suction-hold the workpiece and is designed to be moved in a processing-feed direction indicated by an arrow X in FIG. 2 by a processing-feed mechanism (not shown) and in an indexing-feed direction indicated by an arrow Y by an indexing-feed mechanism that is not shown.

The above laser beam application means 32 is installed in a cylindrical casing 321 arranged substantially horizontally. This laser beam application means 32 will be described with reference to FIG. 3.

Figure 3:
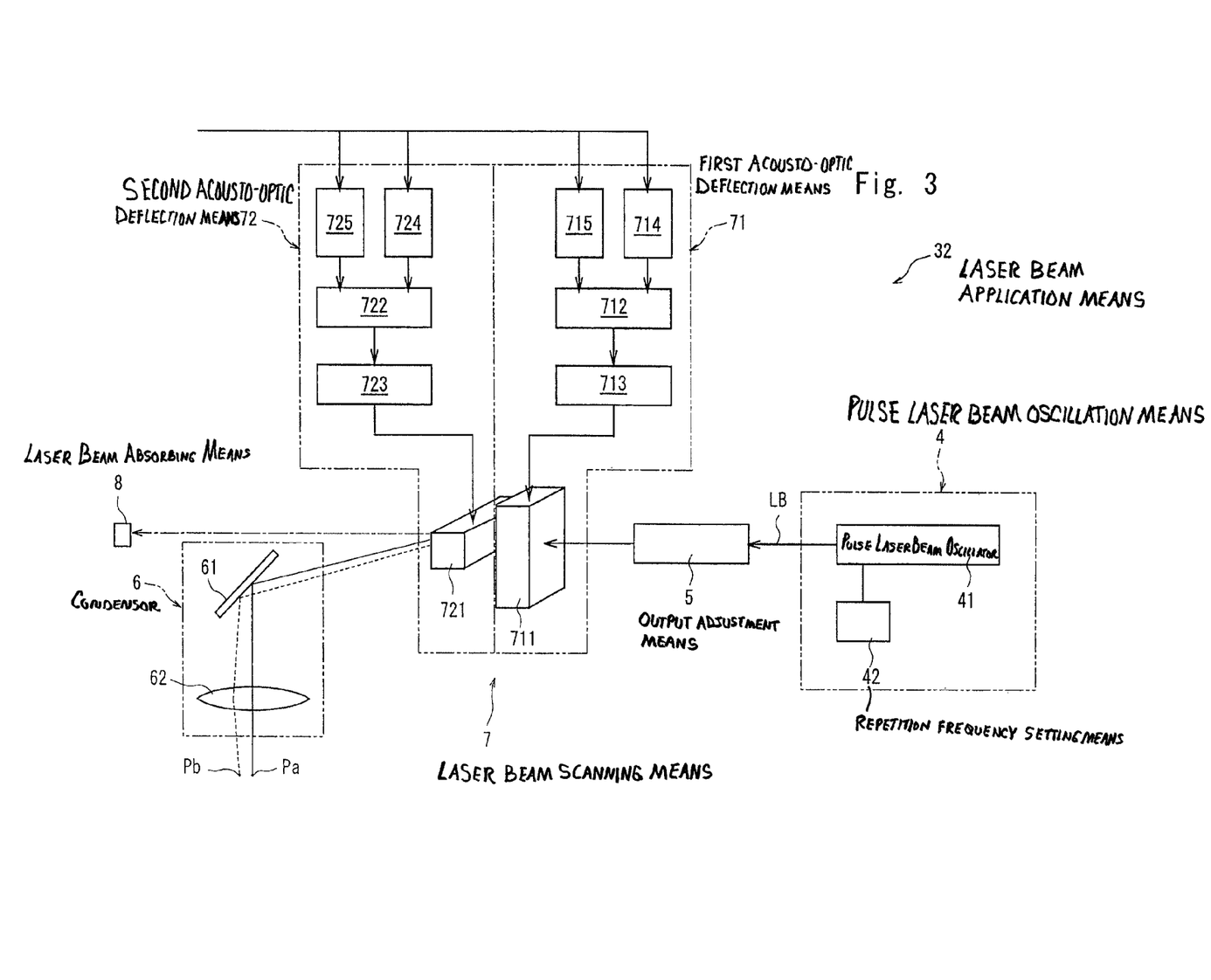
FIG. 3 is a block diagram of a laser beam application means provided in the laser beam processing machine shown in FIG. 2.

The laser beam application means 32 shown in FIG. 3 has a pulse laser beam oscillation means 4, an output adjustment means 5, a condenser 6 for converging a pulse laser beam which has been oscillated from the pulse laser beam oscillation means 4 and whose output has been adjusted by the output adjustment means 5, and a laser beam scanning means 7 interposed between the output adjustment means 5 and the condenser 6.

The above pulse laser beam oscillation means 4 is constituted by a pulse laser beam oscillator 41 and a repetition frequency setting means 42 connected to the pulse laser beam oscillator 41. The pulse laser beam oscillator 41 is composed of a YVO4 laser or YAG laser oscillator in the illustrated embodiment and oscillates a pulse laser beam LB of a wavelength (for example, 355 nm) having absorptivity for a workpiece made of silicon. The above output adjustment means 5 adjusts the output of the pulse laser beam LB oscillated from the pulse laser beam oscillation means 4 to a predetermined value.

The above condenser 6 comprises a direction changing mirror 61 for changing the direction of the pulse laser beam LB to a downward direction and a condenser lens 62 for converging the pulse laser beam LB whose direction has been changed by the direction changing mirror 61, and is attached to the end of the casing 321 as shown in FIG. 2.

The above laser beam scanning means 7 comprises a first acousto-optic deflection means 71 for deflecting the optical axis of a laser beam oscillated from the pulse laser beam oscillation means 4 in the processing-feed direction (X direction) and a second acousto-optic deflection means 72 for deflecting the optical axis of a laser beam oscillated from the pulse laser beam oscillation means 4 in the indexing-feed direction (Y direction).

The above first acousto-optic deflection means 71 has a first acousto-optic device 711 for deflecting the optical axis of a laser beam oscillated from the pulse laser beam oscillation means 4 in the processing-feed direction (X direction), a first RF oscillator 712 for generating RF (radio frequency) to be applied to the first acousto-optic device 711, a first RF amplifier 713 for amplifying the power of RF generated by the first RF oscillator 712 to apply it to the first acousto-optic device 711, a first deflection angle adjustment means 714 for adjusting the frequency of RF generated by the first RF oscillator 712, and a first output adjustment means 715 for adjusting the amplitude of RF generated by the first RF oscillator 712. The above first acousto-optic device 711 can adjust the deflection angle of the optical axis of a laser beam according to the frequency of the applied RF and the output of a laser beam according to the amplitude of the applied RF. The above first deflection angle adjustment means 714 and the above first output adjustment means 715 are controlled by a control means that is not shown.

The above second acousto-optic deflection means 72 comprises a second acousto-optic device 721 for deflecting the optical axis of a laser beam oscillated from the pulse laser beam oscillation means 4 in the indexing-feed direction perpendicular to the processing-feed direction (X direction), a second RF oscillator 722 for generating RF to be applied to the second acousto-optic device 721, a second RF amplifier 723 for amplifying the power of RF generated by the second RF oscillator 722 to apply it to the second acousto-optic device 721, a second deflection angle adjustment means 724 for adjusting the frequency of RF generated by the second RF oscillator 722, and a second output adjustment means 725 for adjusting the amplitude of RF generated by the second RF oscillator 722. The above second acousto-optic device 721 can adjust the deflection angle of the optical axis of a laser beam according to the frequency of the applied RF and the output of a laser beam according to the amplitude of the applied RF. The above second deflection angle adjustment means 724 and the above second output adjustment means 725 are controlled by the control means that is not shown.

The laser beam application means 32 in the illustrated embodiment comprises a laser beam absorbing means 8 for absorbing a laser beam not deflected by the first acousto-optic device 711 as shown by the dashed-dotted line in FIG. 3 when RF is not applied to the above first acousto-optic device 711.

The laser beam application means 32 in the illustrated embodiment is constituted as described above. When RF is not applied to the first acousto-optic device 711 and the second acousto-optic device 721, a pulse laser beam oscillated from the pulse laser beam oscillation means 4 is guided to the laser beam absorbing means 8 through the output adjustment means 5, the first acousto-optic device 711 and the second acousto-optic device 721, as shown by the dashed-dotted line in FIG. 3. Meanwhile, when RF having a frequency of, for example, 10 kHz is applied to the first acousto-optic device 711, the optical axis of a pulse laser beam oscillated from the pulse laser beam oscillation means 4 is deflected and focused at a focal point Pa as shown by the solid line in FIG. 3. When RF having a frequency of, for example, 20 kHz is applied to the first acousto-optic device 711, the optical axis of a pulse laser beam oscillated from the pulse laser beam oscillation means 4 is deflected and focused at a focal point Pb which shifts from the above focal point Pa by a predetermined distance in the processing-feed direction (X direction), as shown by the dashed line in FIG. 3. When RF having a predetermined frequency is applied to the second acousto-optic device 721, the optical axis of a pulse laser beam oscillated from the pulse laser beam oscillation means 4 is focused at a focal point which shifts from the above focal point Pa by a predetermined distance in the indexing-feed direction (Y direction: perpendicular to the sheet in FIG. 3) perpendicular to the processing-feed direction (X direction).

Figure 4:
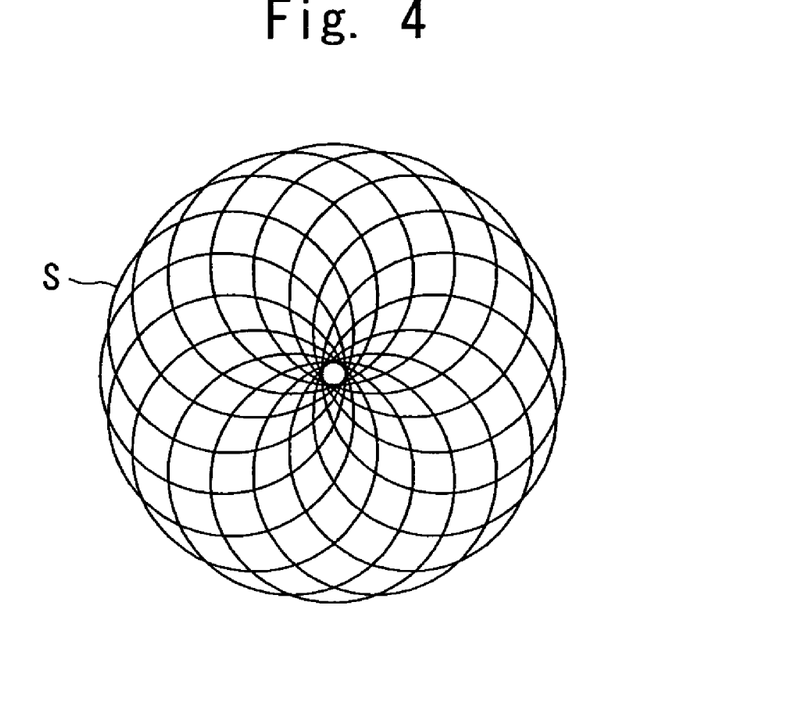
FIG. 4 is an explanatory diagram showing trepanning processing which is carried out by the laser beam application means shown in FIG. 3.

Therefore, trepanning processing for moving the spot S of the pulse laser beam annularly as shown in FIG. 4 can be carried out by activating the first acousto-optic deflection means 71 and the second acousto-optic deflection means 72 to deflect the optical axis of the pulse laser beam in the X direction and Y direction sequentially.

Returning to FIG. 2, the illustrated laser beam processing machine 3 has an image pick-up means 33 mounted on the end portion of the casing 321 constituting the above laser beam application means 32. This image pick-up means 33 is constituted by an infrared illuminating means for applying infrared radiation to the workpiece, an optical system for capturing infrared radiation irradiated by the infrared illuminating means, and an image pick-up device (infrared CCD) for outputting an electric signal corresponding to infrared radiation captured by the optical system, in addition to an ordinary image pick-up device (CCD) for picking up an image with visible radiation, in the illustrated embodiment. An image signal obtained is supplied to the control means that is not shown.

A description will be subsequently given of the method of forming via holes in the above semiconductor wafer 2 by using the above-described laser beam processing machine 3.

The front surface 21a of the semiconductor wafer 2 is first placed on the chuck table 31 of the laser beam processing machine 3 shown in FIG. 2, and the semiconductor wafer 2 is suction-held on the chuck table 31 (wafer holding step). Therefore, the semiconductor wafer 2 is held in such a manner that the rear surface 21b faces up.

The chuck table 31 suction-holding the semiconductor wafer 2 by carrying out the above wafer holding step is brought to a position right below the image pick-up means 33 by the processing-feed mechanism that is not shown. After the chuck table 31 is positioned right below the image pick-up means 33, the semiconductor wafer 2 on the chuck table 31 becomes a state where it is located at a predetermined coordinate position. In this state, alignment work for checking whether the streets 22 formed in a lattice pattern on the semiconductor wafer 2 held on the chuck table 31 are parallel to the X direction and the Y direction is carried out (aligning step). That is, the image pick-up means 33 picks up an image of the semiconductor wafer 2 held on the chuck table 31 and carries out image processing such as pattern matching, etc. to perform the alignment work. Although the street 22 formed front surface 21a of the substrate 21 of the semiconductor wafer 2 faces down at this point, an image of the streets 22 can be picked up through the rear surface 21b of the substrate 21 as the image pick-up means 33 is constituted by the infrared illuminating means, an optical system for capturing infrared radiation and an image pick-up device (infrared CCD) for outputting an electric signal corresponding to the infrared radiation, as described above.

By carrying out the above-described aligning step, the semiconductor wafer 2 held on the chuck table 31 is located at the predetermined coordinate position. Data on the designed coordinate positions of the plurality of bonding pads 24 formed on the devices 23 on the front surface 21a of the substrate 21 of the semiconductor wafer 2 are stored in the control means (not shown) of the laser beam processing machine 3 in advance.

Figure 5:
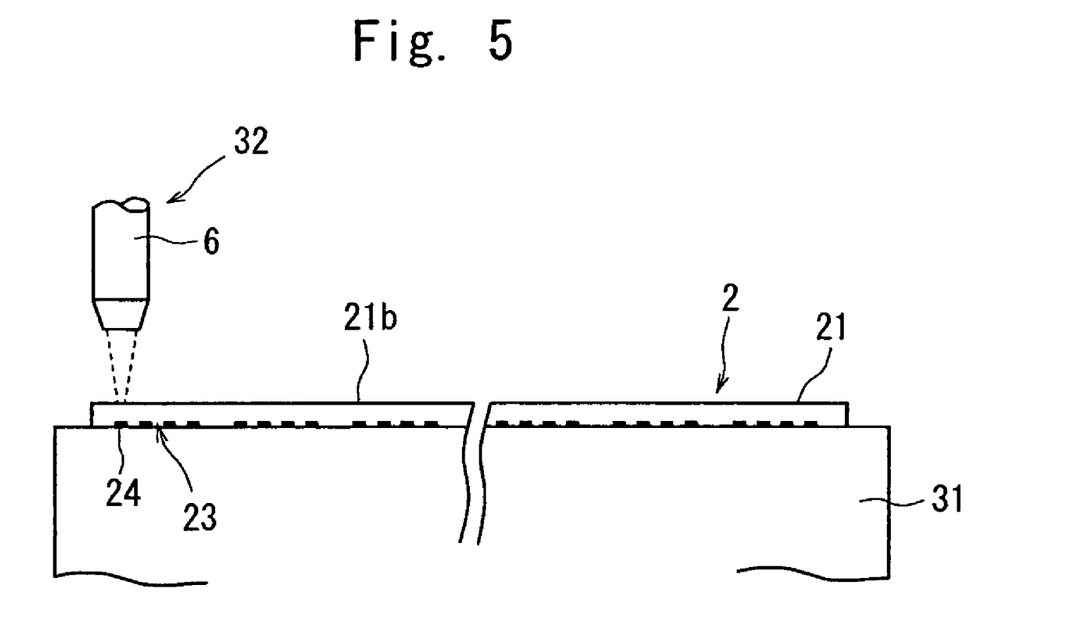
FIG. 5 is a diagram showing a state where the via hole forming area of the semiconductor wafer held on the chuck table of the laser beam processing machine shown in FIG. 2 has been positioned right below a condenser.

After the above alignment work is carried out, the chuck table 31 is moved as shown in FIG. 5 to bring a device 23 at the most left end in FIG. 5 out of the plurality of devices 23 formed in a predetermined direction on the substrate 21 of the semiconductor wafer 2 to a position right below the condenser 6. Then, a bonding pad 24 at the most left end out of the plurality of bonding pads 24 formed on the device 23 at the most left end in FIG. 5 is brought to a position right below the condenser 6.

After the predetermined bonding pad 24 is positioned right below the condenser 6 as shown in FIG. 5, next comes the step of forming a via hole reaching the bonding pad 24 by applying a pulse laser beam from the condenser 6 of the above laser beam application means 32. In this via hole forming step, trepanning processing is carried out under the following processing conditions.

Processing conditions of via hole forming step:
Light source of laser beam: YVO4 laser or YAG laser
Wavelength: 355 nm
Energy density per pulse: 30 to 40 J/cm$^2$
Spot diameter (d): $D/2 \leq d \leq D-2$ μm when the diameter of the via hole to be formed is represented as D.

The method of applying a pulse laser beam in the above via hole forming step will be described hereinbelow.

Figure 6:
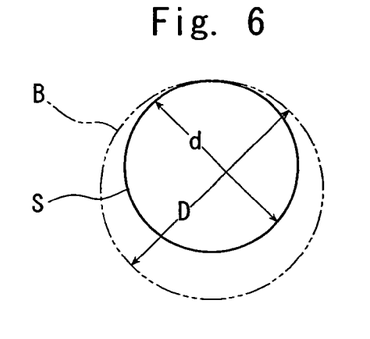
FIG. 6 is an explanatory diagram showing the relationship between the diameter of a via hole to be formed by the via hole forming method of the present invention and the diameter of the spot of a pulse laser beam to be applied.

FIG. 6 shows the relationship between the diameter D of a via hole B to be formed and the diameter d of the spot S of a pulse laser beam to be applied. That is, the relationship of the diameter d of the spot S of the pulse laser beam to be applied with respect to the diameter of the via hole to be formed is set to be $D/2 \leq d \leq D-2$ μm. And, the pulse laser beam is applied in such a manner that the periphery of the spot S of the pulse laser beam moves along the inner circumference of the via hole B to be formed. At this point, the pulse laser beam is applied at a phase angle of 120 to 180° from the previous application position.

The first method of applying a pulse laser beam under the above conditions will be described with reference to FIGS. 7(a) and 7(b).

Figure 7:
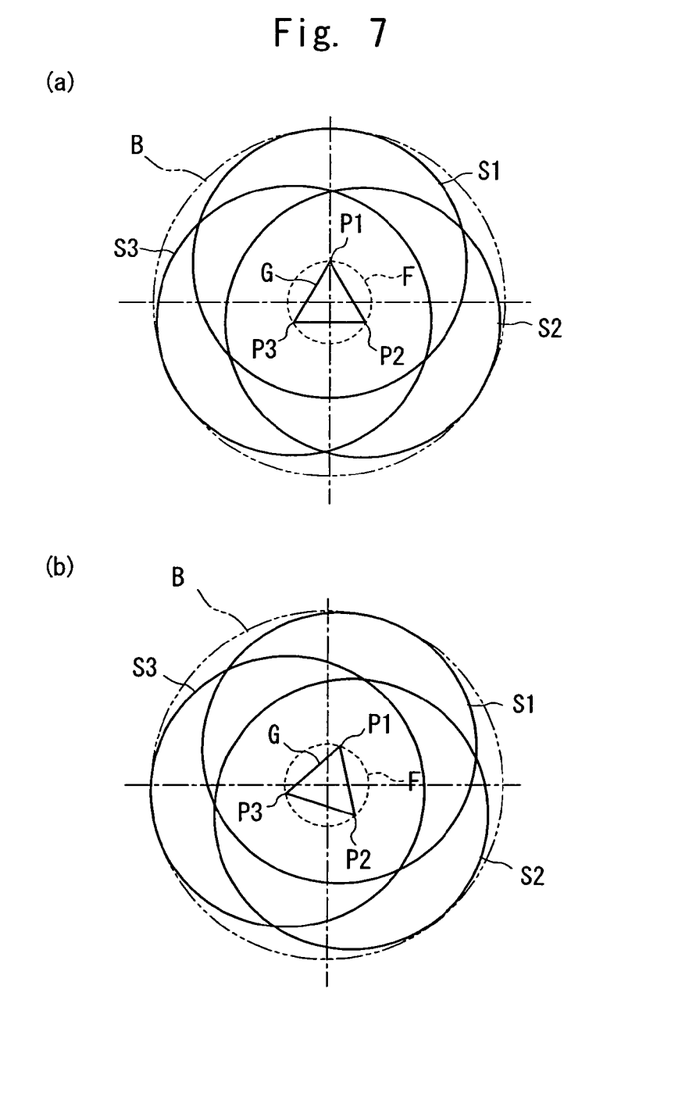
FIGS. 7(a) and 7(b) are explanatory diagrams showing a first embodiment of the via hole forming method of the present invention.
Figure 8:
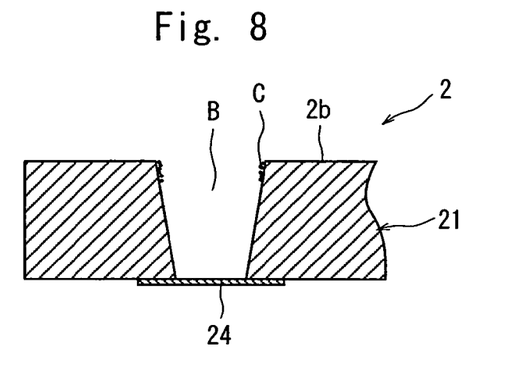
FIG. 8 is a sectional view of the semiconductor wafer having a via hole formed by the via hole forming method of the present invention.

First, as shown in FIG. 7(a), an equilateral triangle G having apexes P1, P2 and P3 is set on a circle F drawn by the movement of the center of the spot S of the pulse laser beam. The laser beam application means 32 applies one pulse with the apex P1 of the equilateral triangle G, as the center thereof (S1). Then, the laser beam application means 32 applies one pulse with the apex P2 of the equilateral triangle G, as the center thereof (S2) and further, one pulse with the apex P3 of the equilateral triangle G, as the center thereof (S3). Thus, the application positions of the spots S1, S2 and S3 of the pulse laser beams are located respectively at a phase angle of 120° from the previous application position. The displacements of the spots S1, S2 and S2 caused by the laser beam application means 32 are controlled by the laser beam scanning means 7 comprising the first acousto-optic deflection means 71 and the second acousto-optic deflection means 72. Then, as shown in FIG. 7(b), the equilateral triangle G having apexes P1, P2 and P3 is turned at, for example, 18° with the center of the via hole B to be formed, as the center thereof, and the laser beam application means 32 applies one pulse each time with the apexes P1, P2 and P3 of the equilateral triangle G, as the centers thereof (S1, S2 and S3). In this case, the spot S1 of the laser beam applied with the apex P1 of the equilateral triangle G as the center thereof is located at a phase angle of 138° from the previous application position (i.e., the position of spot S3 of the laser beam applied with the apex P3 of the equilateral triangle G, as the center thereof in FIG. 7(a)). The spots S2 and S3 of the laser beams applied with the apexes P2 and P3 of the equilateral triangle G, as the centers thereof are located at a phase angle of 120° from the previous application position. Afterward, the equilateral triangle G having apexes P1, P2 and P3 is turned sequentially at 18° with the center of the via hole B to be formed, as the center thereof, and the laser beam application means 32 applies one pulse each time with the apexes P1, P2 and P3 of the equilateral triangle G, as the centers thereof (S1, S2 and S3). When the equilateral triangle G having apexes P1, P2 and P3 is thus turned 10 times and one pulse is applied each time with the apexes P1, P2 and P3, as the centers thereof, 30 pulses in total are meant to be applied to the substrate 21 of the semiconductor wafer 2. Consequently, in the case of a silicon substrate having a thickness of 100 µm, as shown in FIG. 8, a via hole B reaching the bonding pad 24 is formed in the substrate 21 of the semiconductor wafer 2. Although debris C adhere to the entire upper portion of the inner wall of the via hole formed as described above, their amounts are small and they do not accumulate on a specific area.

A description will be subsequently given of the second method of applying a pulse laser beam in the via hole forming step with reference to FIGS. 9(a) and 9(b).

Figure 9:
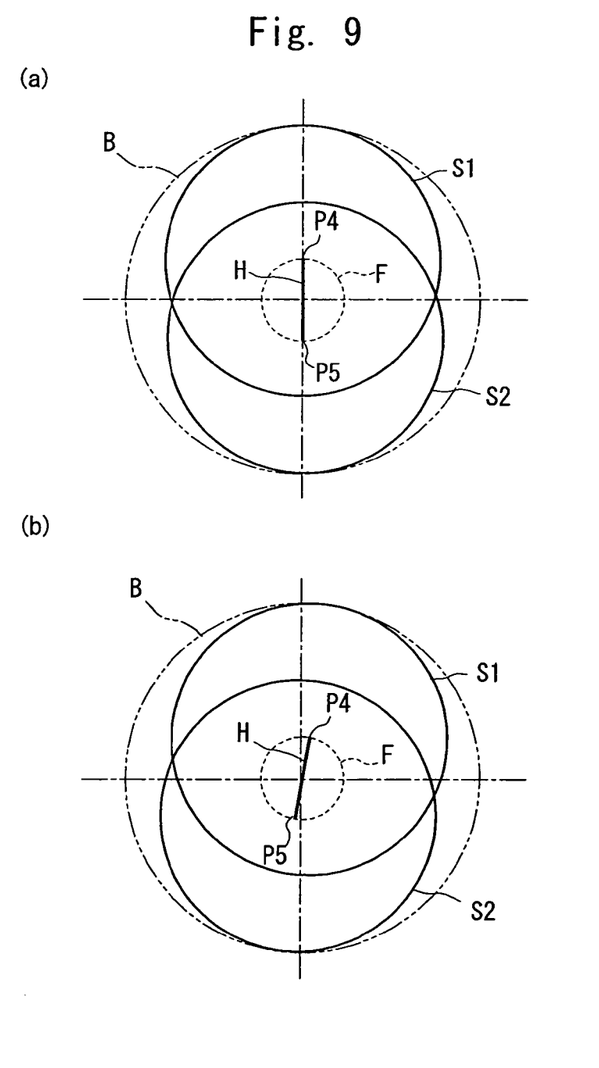
FIGS. 9(a) and 9(b) are explanatory diagrams showing a second embodiment of the via hole forming method of the present invention.

In the second application method, as shown in FIG. 9(a), a straight line H passing through the center of the via hole B to be formed is set on the circle F drawn by the movement of the center of the spot S of the pulse laser beam. The laser beam application means 32 applies one pulse with one end P4 of the straight line H, as the center thereof (S1). Then, the laser beam application means 32 applies one pulse with the other end P5 of the straight line H, as the center thereof (S2). The application positions of the spots S1 and S2 of the pulse laser beams thus applied become point symmetrical with respect to the center of the via hole B to be formed, and the spot S2 is located at a phase angle of 180° from the previous application position (i.e., the application position of spot S1). Then, as shown in FIG. 9(b), the straight line H is turned at, for example, 10° with the center of the via hole B to be formed, as the center thereof, and the laser beam application means 32 applies one pulse each time with both ends P4 and P5 of the straight line H, as the centers thereof (S1 and S2). In this case, the spot S1 applied with one end P4 of the straight line H, as the center thereof is located at a phase angle of 170° from the previous application position (i.e., the position of spot S2 applied with the other end P5 of the straight line H in FIG. 9(a) as the center thereof). The spot S2 applied with the other end P5 of the straight line H, as the center thereof is applied at a phase angle of 180° from the previous application position. Afterward, the straight line H is turned at, for example, 12° each time with the center of the via hole B to be formed, as the center thereof, and the laser beam application means 32 applies one pulse with one end P4 and the other end P5 of the straight line H, as the centers thereof, sequentially. When the straight line H is thus turned 15 times and one pulse is applied each time with the one end P4 and the other end P5 of the straight line H, as the centers thereof, 30 pulses in total are meant to be applied to the substrate 21 of the semiconductor wafer 2. Consequently, in the case of a silicon substrate having a thickness of 100 µm, as shown in FIG. 8, a via hole B reaching the bonding pad 24 is formed in the substrate 21 of the semiconductor wafer 2.

Since the spot of the pulse laser beam is applied at a phase angle of 120 to 180° from the previous application position in the above embodiment as described above, debris scattered by applying the pulse laser beam to the substrate 21 of the semiconductor wafer 2 do not concentrate on a specific area, whereby the debris do not accumulate at one-sided position of the upper portion of the inner wall of the via hole B. Therefore, an insulating material can be formed on the inner wall of the via hole B properly.

What is claimed is:

1. A method of forming a via hole by a laser beam application means capable of being scanned over the wafer by relative movement of the laser beam application means and the wafer, the via hole reaching a bonding pad in a wafer having a plurality of devices on a front surface of a substrate and bonding pads formed on each of the devices by applying a pulse laser beam with the laser beam application means from a rear surface side of the substrate, said method comprising:

providing the pulse laser beam so as to have a spot diameter which satisfies $D/2 \leq d \leq D-2$ µm (wherein a diameter of the via hole to be formed is represented as D and a spot diameter of the pulse laser beam is represented as d);

scanning such that the periphery of the beam spot, when the beam is provided from the laser beam application means, moves along the inner circumference of the via hole to be formed;

while scanning, causing the laser beam application means to apply the beam for a first pulse, a second pulse, and a third pulse during a first beam application, the first, second and third pulses defining a first equilateral triangle having three apexes on a circle drawn by how the center of the spot would move during scanning if the beam were constantly present, each pulse corresponding to one of the three apexes;

changing scanning and thereafter, while scanning, causing the laser beam application means to apply a first pulse, a second pulse, and a third pulse during a second beam application in which the first, second and third pulses of the second application define apexes of a second equilateral triangle turned at a predetermined angle with respect to the first equilateral triangle, wherein each pulse is applied at an angle of 120 to 180° from a previous pulse.

2. The method of claim 1, comprising further repeating changing of scanning n times and, after each time, while continuing scanning, causing the laser beam application means to apply three pulses to define apexes of an equilateral triangle.

* * * * *